(12) United States Patent
Heckhausen et al.

(10) Patent No.: US 8,653,814 B2
(45) Date of Patent: Feb. 18, 2014

(54) HOUSING FOR A MAGNETOMETER, A COMBINATION INCLUDING A MAGNETOMETER WITHIN A WATERPROOF HOUSING, AND A SYSTEM AND METHOD FOR LOCATION AND REMOVAL OF UNEXPLODED ORDINANCE UNDERWATER

(75) Inventors: Kim A. Heckhausen, Taunton, MA (US); Elliott J. Adler, Knoxville, TN (US); Thomas C. Rancich, West Tisbury, MA (US)

(73) Assignee: VRHALIBIS, LLC, West Tisbury, MA (US)

( * ) Notice: Subject to any disclaimer, the term of this patent is extended or adjusted under 35 U.S.C. 154(b) by 972 days.

(21) Appl. No.: 12/652,824

(22) Filed: Jan. 6, 2010

(65) Prior Publication Data
US 2011/0163747 A1 Jul. 7, 2011

(51) Int. Cl.
*G01R 33/00* (2006.01)
(52) U.S. Cl.
USPC ........................................................ 324/260
(58) Field of Classification Search
USPC .................................. 324/223, 260–261, 326
See application file for complete search history.

(56) References Cited

U.S. PATENT DOCUMENTS

| 3,894,283 | A | * | 7/1975 | Schonstedt | 324/345 |
| 4,163,877 | A | * | 8/1979 | Schonstedt | 324/226 |
| 4,540,943 | A | * | 9/1985 | Akers | 324/326 |
| 5,770,945 | A | * | 6/1998 | Constable | 324/350 |
| 7,030,616 | B1 | * | 4/2006 | Boland et al. | 324/329 |
| 7,116,108 | B2 | * | 10/2006 | Constable | 324/350 |
| 8,148,992 | B2 | * | 4/2012 | Kowalczyk et al. | 324/365 |
| 8,487,605 | B1 | * | 7/2013 | Dea | 324/72 |
| 8,514,656 | B2 | * | 8/2013 | Juhasz et al. | 367/20 |

* cited by examiner

*Primary Examiner* — Joshua Benitez Rosario
(74) *Attorney, Agent, or Firm* — Matthew J. Lattig; Charter IP, LLC (57) ABSTRACT

A waterproof housing that encloses a hand-held magnetometer for underwater use and includes a first portion open at one end and connected to a second portion with one end open and accessible through the first portion and terminating at a closed end. The magnetometer has first and second housings and is inserted into the first portion open end so that the second housing is received into the second portion and the first housing is received into the first portion. A base seal is inserted into the first portion open end to provide a fully functional magnetometer protected from water incursion at depth.

15 Claims, 9 Drawing Sheets

HOUSING FOR A MAGNETOMETER, A COMBINATION INCLUDING A MAGNETOMETER WITHIN A WATERPROOF HOUSING, AND A SYSTEM AND METHOD FOR LOCATION AND REMOVAL OF UNEXPLODED ORDINANCE UNDERWATER

BACKGROUND

1. Field

Example embodiments in general are directed to a waterproof housing for a magnetometer, a combination including a magnetometer within a waterproof housing and to a system and method for location and removal of unexploded ordinance underwater.

2. Related Art

Devices for locating magnetic objects and/or for detecting or measuring magnetic fields are well known. Such devices can include a plurality of magnetic sensor units having spaced-apart windings or coils that are mounted within a non-magnetic tubular housing. U.S. Pat. No. 4,163,877 to Schonstedt is an example of a prior art magnetic detector, hereafter referred to as a "magnetic locator".

Saturable core (fluxgate) magnetic locators or gradiometers comprise at least two electrically matched field-sensing elements mounted on a non-magnetic structure such that their magnetic axes are, theoretically, precisely parallel or coaxial. The output signals of the two sensors are arranged such that they oppose each other. If the structure is oriented in any direction in a uniform magnetic field, the components of magnetic field existing at each sensor are equal, so that there is no resulting output signal from the combination of the two sensors.

If a magnetic object exists within the detection range of the instrument, the magnetic field will generally be stronger at one of the sensors than at the other sensor. As a result, the output signal of one sensor will be greater than that of the other, so a net difference signal will be produced that is indicative of the presence of the object.

Figures 1, 2A, 2B, 3:
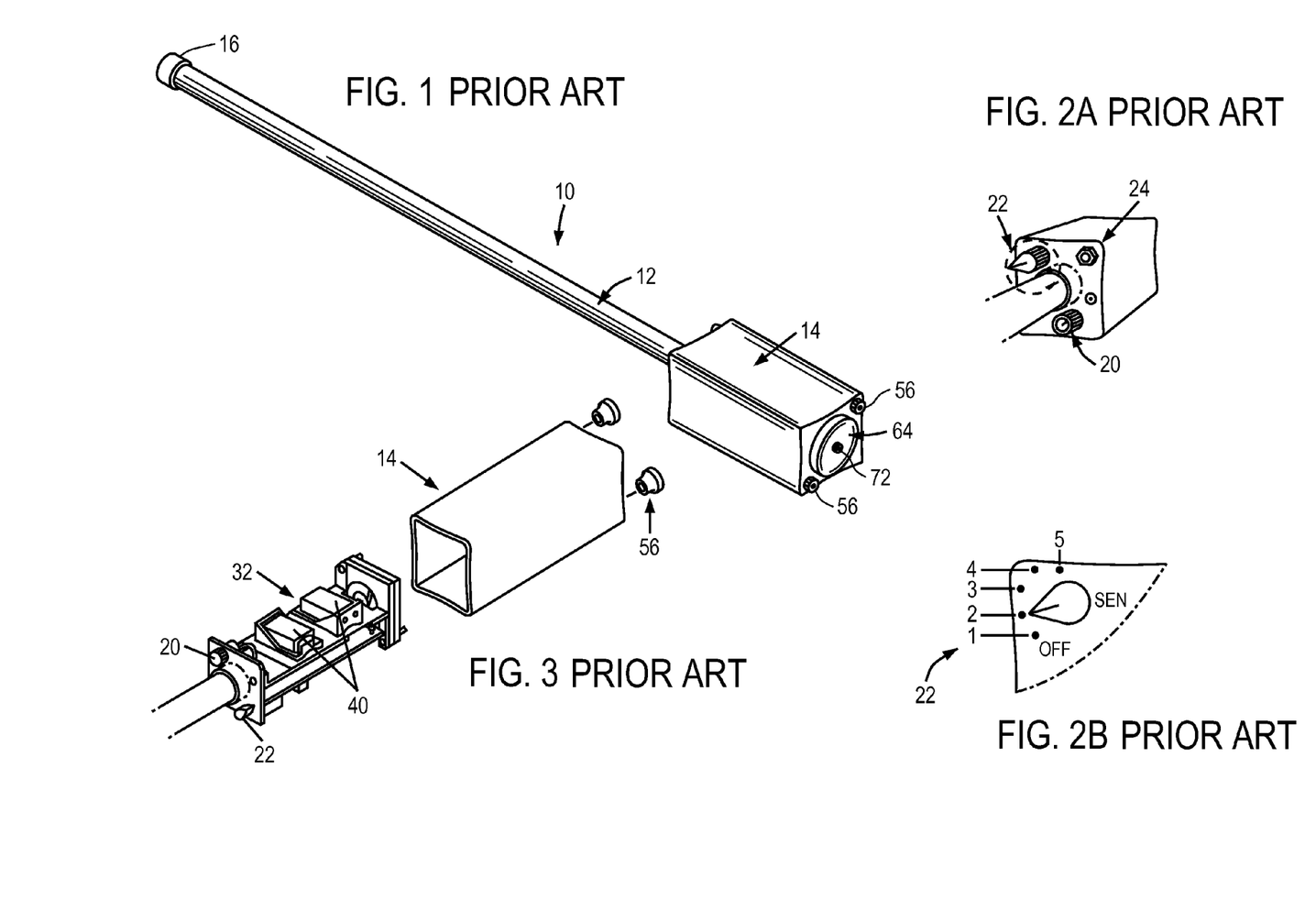
FIG. 1 is a perspective view of a conventional magnetic locator.
FIG. 2A is a partial front view of the housing to show various control knobs.
FIG. 2B is an enlarged view of the dotted line circle in FIG. 2A.
FIG. 3 is a partial exploded view with the housing removed.

FIGS. 1-6 are directed in general to characteristics of a conventional "fluxgate" magnetic locator (also known as a "magnetometer") used for locating ferromagnetic objects such as corner markers, gas lines, septic tanks, steel pipes, unexploded ordnance, water/sewer lines and the like, a commercially-known example being the Model GA-52Cx magnetic locator by Schonstedt Instrument Company. FIG. 1 is a perspective view of a conventional magnetic locator. As shown in FIG. 1, the magnetic locator 10 includes a tubular housing 12 connected to a housing 14 of larger cross-dimensions. Housing 12 is formed of non-magnetic material, such as aluminum, and includes a pair of spaced, aligned flux-gate magnetic sensors, shown generally as "sensor A" and "sensor B" in FIG. 4.

Housing 14 is formed of aluminum and contains the electronics for exciting the sensors and for processing signals from the sensors. In use, the locator 10 can be grasped at a portion of housing 12 near housing 14, and the tip 16 of housing 12 is swept along the ground to detect a buried magnetic object, for example. An audible signal indicative of the detection of magnetic objects is produced by a loudspeaker as described hereinafter. Holes (not shown) in the end wall of housing 14 are provided for the transmission of sound from a loudspeaker to the exterior of the housing 14. The holes are covered by a shield 64 that is secured to the housing 14 via a mounting screw 72.

FIG. 2A is a partial front view of the housing 14 to show various control knobs, and FIG. 2B is an enlarged view of the dotted line circle in FIG. 2A. Referring to FIG. 2A, the housing 14 includes a volume control knob 20, an on/off/sensitivity control knob 22 (hereafter "sensitivity control knob 22", shown in dotted circle) and a headset jack 24. FIG. 2B illustrates the off position and five (5) sensitivity positions of the sensitivity control knob 22. In an example operating configuration, sensitivity control knob 22 can be set to position 2 and the volume control knob 20 can be adjusted until the idling tone reaches a desired level. The magnetic locator 10 can be oriented in any direction without producing a significant change in the frequency of the tone from its idling frequency. Additionally, when using headphones plugged into jack 24, the volume control knob 20 has no affect on the output level of the audio signal.

FIG. 3 is a partial exploded view with the housing 14 removed. The magnetic locator 10 is powered by two alkaline 9-Volt batteries 40, such as alkaline or lithium batteries. The batteries 40 are carried in a battery holder 32 as illustrated in FIG. 3. Access to the batteries 40 is obtained by removing the two knurled nuts 56 and sliding off the housing 14.

Figure 4:
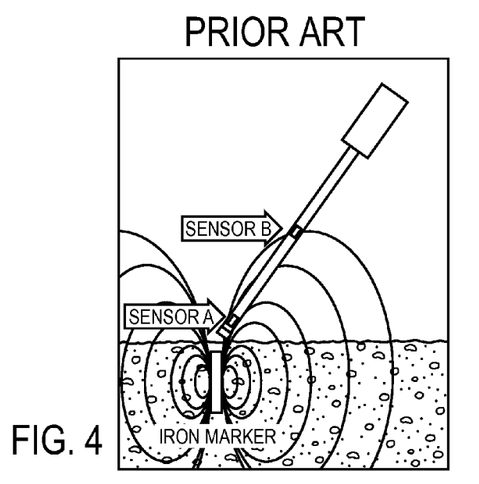
FIG. 4 shows an application of the locator in which it is used to detect an iron marker of the type used for property line identification.
Figure 5:
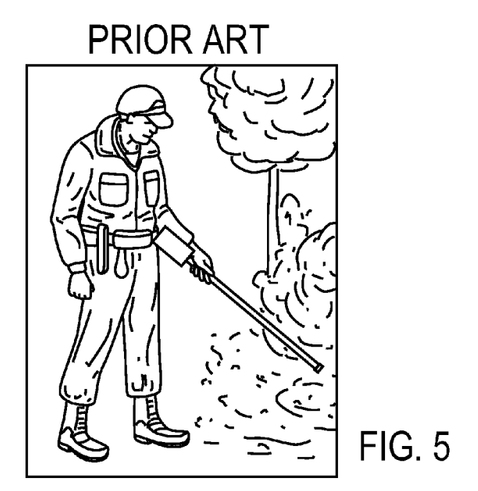
FIG. 5 illustrates example holding of the locator for a search.
Figure 6:
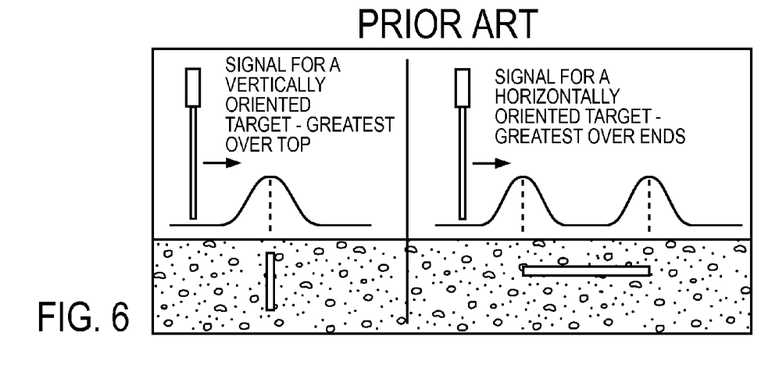
FIG. 6 illustrates basic signal patters for vertical and horizontal targets.

FIGS. 4-6 describe the function and operation of the magnetic locator 10. The magnetic locator 10 detects the magnetic field of a ferromagnetic object. The magnetic locator 10 responds to the difference in the magnetic field between two sensors A, B spaced about 20 inches apart. The response is a change in the frequency of the signal emitted by the piezoelectric speaker. FIG. 4 shows an application of the locator 10 in which it is used to detect an iron marker of the type used for property line identification. As shown, the magnetic field of the iron marker is stronger at sensor A than it is at sensor B. As a result, the frequency from the piezoelectric speaker is higher than the idling frequency, 40 Hz, which exists when the field strength is the same at both sensors. Accordingly, as this magnetic locator 10 employs flux-gate sensors it is sometimes referred to as a "flux-gate magnetometer".

To conduct the search, the user sets the sensitivity and adjusts the volume (or wears headphones), then grasps the tubular housing 12 above sensor B, generally near the front of housing 14 as shown in FIG. 5. Because the upper sensor B is located near where the locator 10 is usually held, wrist watches may produce unwanted changes in the tones frequency. The locator 10 is kept away from the shoes, since shoes might contain magnetic material. To obtain maximum area coverage, the locator 10 should be swept from side-to-side. When the locator 10 comes within range of an object, the holder or user will hear an increase in the frequency of the output signal.

FIG. 6 illustrates basic signal patters for vertical and horizontal targets. After the user has detected the presence of a target, the locator 10 is held vertically and moved back and forth in an "X" pattern. The peak signal occurs directly over a vertical target, and over the ends of a horizontal target, as shown in FIG. 6.

Detecting unexploded ordinance is one of the many applications of the magnetic locator 10, as noted above. Upon the closing of military bases during the first round of Base Realignment and Closure (BRAC) in the early 1990s, a new industry revolving around the removal of Unexploded Ordinance (UXO) and Munitions and Explosives of Concern (MEC) was born. Over the course of the next twenty years the industry matured but the basic principle to remove an anomaly in the ground remained the same; lay a grid over an area, have an Explosive Ordinance Disposal Technician (EOD Tech) walk systematically through that grid with a magnetometer, and dig any anomalies.

In January 2009 the Army Corps of Engineers let a solicitation to conduct a Time Critical Removal Action (TCRA)

underwater at South Beach on the Island of Martha's Vineyard, Mass. The major obstacle to completing that work was the lack of a diver-held magnetometer that was waterproof. Conventional protocol and methodologies existed to clear land-based anomalies using magnetic locators such as the Model GA-52Cx. However, no protocol had been developed to search for and remove UXO and MEC underwater, no quality assurance (QA) check was possible, and conventional magnetic locators such as the GA-52Cx are not configured for underwater operations.

SUMMARY

An example embodiment of the present invention is directed to a waterproof housing for underwater use of a hand-held magnetometer. The waterproof housing includes an elongate, generally hollow tubular lower housing portion having a first diameter and being closed at one end and open at another end, the lower housing portion adapted to enclose an elongate lower tubular housing portion of the magnetometer. The waterproof housing includes a cylindrically hollow upper housing portion having a second diameter substantially larger relative to the first diameter of the lower housing portion and attached to the open end of the lower housing portion. The upper housing portion is open at its other end and adapted to enclose an electronics and power supply housing of the magnetometer. The waterproof housing includes a base seal removably connected to the open end of the upper housing portion, the base seal being removed to insert the magnetometer therein so that the tubular housing portion slides into the lower housing portion and the electronics and power supply housing of the magnetometer is captured within the upper housing portion, the base seal being secured into the upper housing portion open end to provide is fully functional magnetometer protected from water incursion at depth.

Another example embodiment is directed to a combination comprising a hand-held magnetometer and a waterproof housing. The magnetometer includes a first housing enclosing electronics and one or more power supplies, and a second housing enclosing one or more sensors that is attached to the first housing. The waterproof housing encloses the hand-held magnetometer for underwater use and has a first portion open at one end and connected to a second portion with one end open and accessible through the first portion and terminating at a closed end. The magnetometer is inserted into the first portion open end so that the second housing is received into the second portion and the first housing is received into the first portion. A base seal is inserted into the first portion open end to provide a fully functional magnetometer protected from water incursion at depth.

Another example embodiment is directed to a system for the underwater location and removal of unexploded ordinance (UXO). The system includes a hand-held magnetometer used by a diver to detect anomalies potentially indicative of UXO in an underwater landmass, a closed-circuit television (CCTV) system, inclusive of camera-mounted optics on a diver, a diver-positioning system to record diver position during a search for anomalies to determine the presence of UXO in the underwater landmass, and two-way audio communications between the diver and a diving supervisor. The CCTV and audio communications enable the diving supervisor to provide quality assurance (QA) checks during the diver's search for anomalies to determine if such qualify as UXO and are to be removed from the landmass.

Another example embodiment is directed to a method for locating and removing UXO in a submerged environment. In the method, a diver is launched into an underwater landmass and the diver commences a sweeping search for ferromagnetic object anomalies potentially indicative of UXO. The diver detects an anomaly and (i) terminates the search to investigate the anomaly more fully, inclusive of digging out the anomaly if determined as UXO, else (ii) marks the location and presence of the anomaly, noting for later investigation and continues the search, else (iii) marks the location and presence of the anomaly and continues the search, and then the diver initiates a UXO removal procedure.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limitative of the example embodiments herein.

DETAILED DESCRIPTION

For purposes of the following description, the term "magnetometer" is analogous to "magnetic locator" as described with respect to the prior art magnetic locator. The example waterproof housing described hereafter is adapted for use with conventional and existing hand-held, magnetic locator devices, the commercial Model GA-52Cx magnetic locator by Schonstedt Instrument Company being merely one example; Dunham & Morrow Model DML2000, SubSurface Instruments Models ML-1 and ML-1M being additional examples of "flux-gate" type magnetic locator devices.

Figure 7:
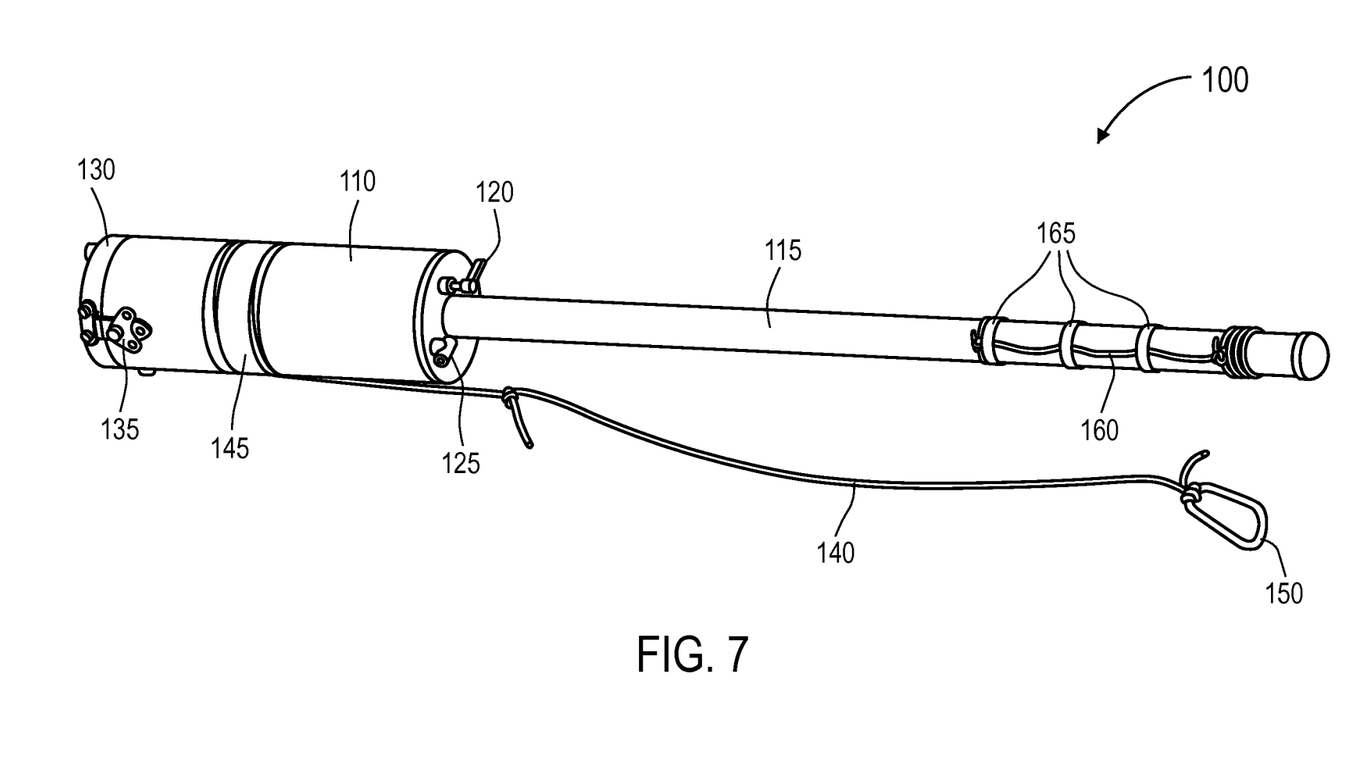
FIG. 7 is a perspective view of a waterproof housing configured for use with a magnetometer in accordance with an example embodiment of the present invention.

FIG. 7 is a perspective view of a waterproof housing configured for use with a magnetometer in accordance with an example embodiment of the present invention. Referring to FIG. 7, there is shown a waterproof housing 100 which comprising an upper housing 110 and a tubular lower housing 115 having a substantially smaller diameter relative to the upper housing 110. The housing 100 is designed to be used with standard, existing, hand-held magnetometers. Once sealed in the housing 100, the magnetometer is fully functional and protected from water incursion at depth. The housing 100 is constructed of non-ferrous material so as not to interfere with the operation of the magnetometer. The housing 100 wholly encapsulates the magnetometer.

For example, the lower housing 115 is designed to receive a "pole" or "broomstick" portion of a conventional magnetometer which typically includes the flux gate sensors therein. As an example, the lower housing 115 may have a length of at least 20 inches, which is a typical length of a section of a magnetometer housing sensors therein. The upper housing 110 is designed to support and house the electronics and power supply (batteries) portion of a magnetometer. In one example, the upper housing 110 and lower housing 115 can be fabricated from a non-ferrous material such as aluminum, and may be joined by a suitable welding process such as by 6061 TG welds, or by V-groove welds all around to achieve up to 100 m working depths. Alternatively, waterproof housing 100 may be a one-piece article formed from an extruded or molded material such as a polycarbonate or ABS, or may be a housing made from a blend thereof.

A base seal 130 is provided at one end of the upper housing 110. Once the magnetometer has been inserted and all connections have been made, the base seal 130 is inserted into the upper housing 110 and latches 135 are tightened so as to lock the base seal 130 into proper position with cam locks, so as to prevent accidental loss of the base seal 130 and subsequent flooding.

As will be seen in further detail below, the housing 100 includes a through housing control fitting 120 and a through housing electronics fitting 125. These serve as watertight through connections to enable the diver to remotely actuate control (sensitivity adjust) and to listen (via the jack) on the magnetometer.

The housing 100 includes a lanyard 140 attached thereto. At one end the lanyard 140 is connected to the upper housing 110 via fastening means 145. The lanyard 140 has a clip 150 at its other end. The clip 150 attaches to the diver's weight belt or harness (not shown) so that the housing 100 with magnetometer is physically secured to the diver.

At a lower end of the lower housing 115 there is provided a piece of clove-hitch line 160 that is divided by a plurality of adhesive strips 165 to form attachments points for receiving a caribiner (not shown) of an air lift. The air lift is used by the diver for removing debris in and around the anomaly of interest. By attaching the bottom of the lower housing 115 to the air lift, the housing 100 always is maintained "on-station" with the air lift during a search procedure.

Figure 8:
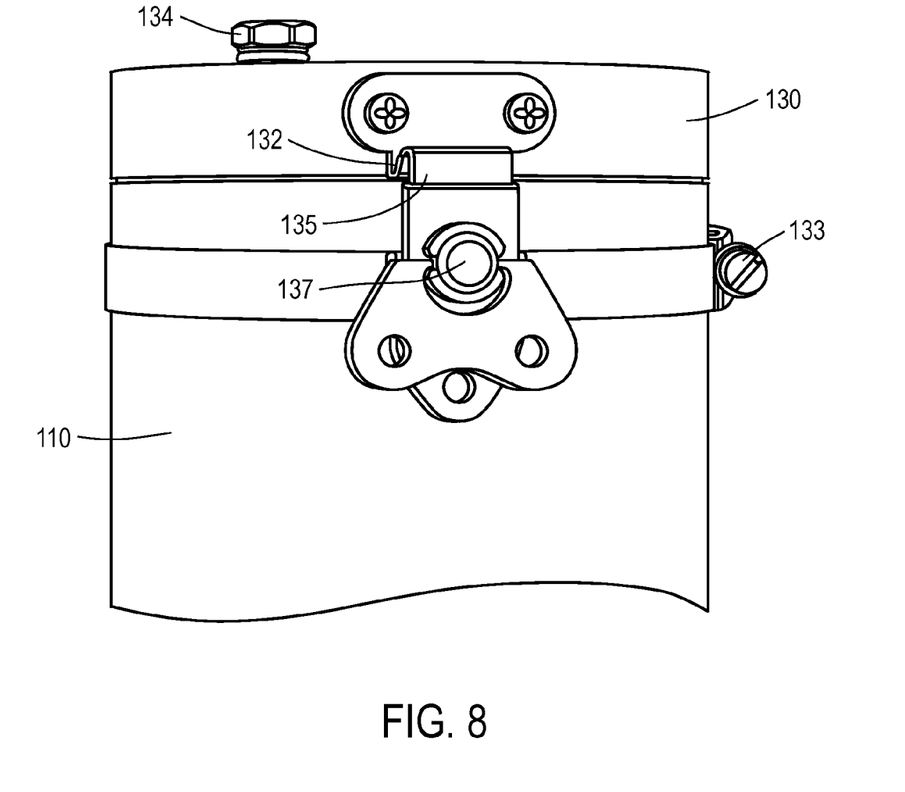
FIG. 8 is an enlarged close-up view of the upper housing to illustrate the seal-to-clamp engagement in further detail.

FIG. 8 is an enlarged close-up view of the upper housing 110 to illustrate the seal-to-clamp engagement in further detail. The base seal 130 includes a pair of latches 132 (only one shown) thereon that engages corresponding latches 135 of cam locks 137 that are supported on a clamp 133 that encircles the upper housing 110. The base seal 130 is locked into proper position with latches 132/135 engaged and cam locks 137 locked down to prevent accidental loss of the base seal 130 and possible subsequent flooding.

The top of base seal 130 includes a ¼" NPT test port 134. A vacuum test pump is attached to test port 134 to confirm the watertight integrity of the housing 100 prior to conducting underwater operations.

Figure 9:
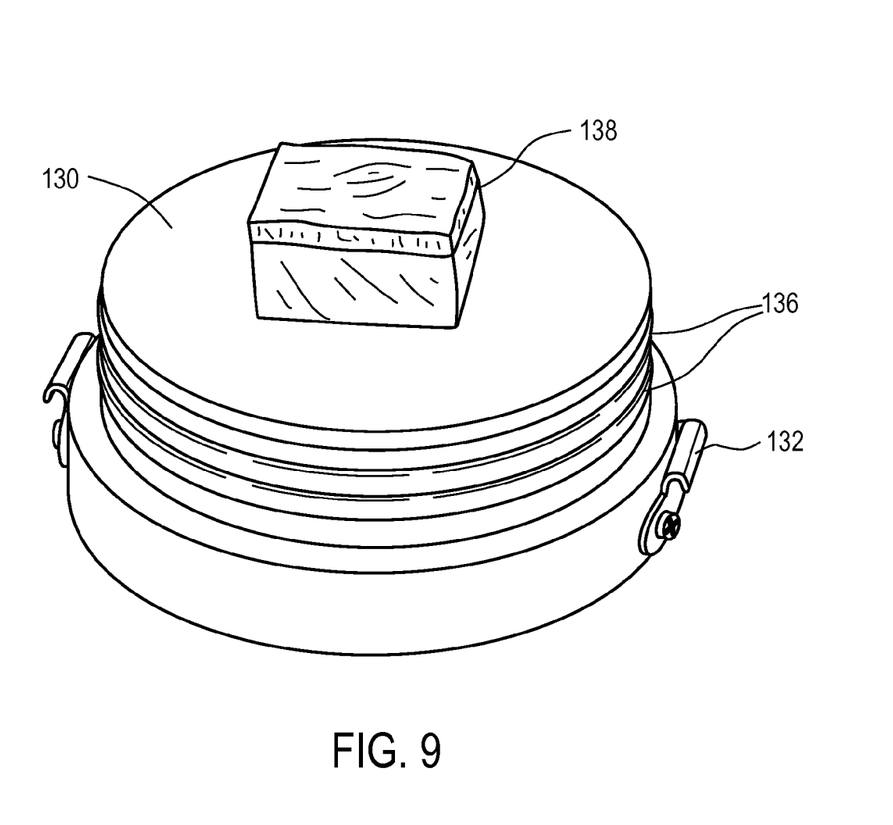
FIG. 9 is a standalone view of the base seal.

FIG. 9 is a standalone view of the base seal 130. The base seal 130 is comprised of a plastic plug machined to fit within the dimensions of the upper housing 130. The seal 130 includes o-rings 136 to prevent water incursion. The base seal 130 is carefully designed to prevent the magnetometer from moving inside the housing 110, and to provide proper distancing for the through housing control fitting 120 and through housing electrical connection 125.

The base seal 130 includes a compression seal 138 (which can be made of an elastomeric material such as rubber, for example). The compression seal 138 is biased against the magnetometer housing (such as against the mounting screw 74 and shield 64 of the housing 14 of FIG. 1) so as to ensure accurate sensitivity control knob engagement with the interior part of the through housing control fitting 120.

Figure 10:
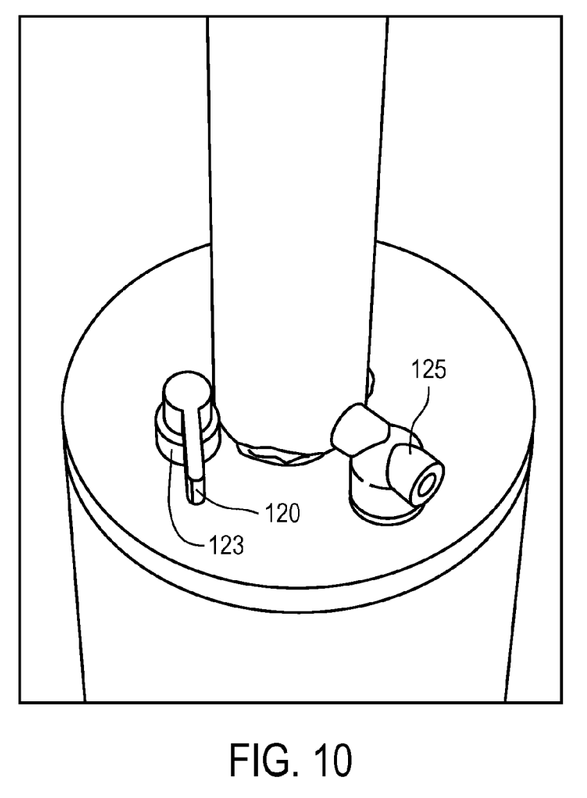
FIG. 10 is a close-up view of a part of the upper housing to illustrate the through housing control fitting in greater detail.
Figure 11:
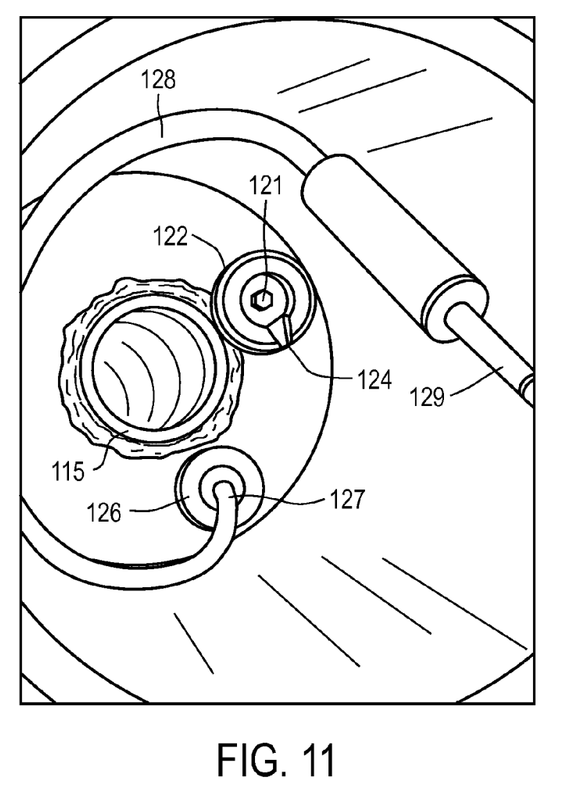
FIG. 11 is an interior view of the upper housing without the magnetometer to illustrate the electronics connection in greater detail.

FIG. 10 is a close-up view of a part of the upper housing 110, and FIG. 11 is an interior view of the upper housing 110 without the magnetometer to illustrate the through housing control fitting 120 and a through housing electronics fitting 125 in greater detail. To maximize watertight integrity, the number of penetrations into the upper housing 110 is minimized. Accordingly, there are only two (2) penetrations into the upper housing 110.

Referring to FIGS. 10 and 11, the upper housing 110 has one through housing control fitting 120 which is used by the diver to turn the magnetometer on and to adjust its sensitivity. The outside control is a simple knob of the control fitting 120. The knob of control fitting 120 is connected to a rod 121 which penetrates through the upper housing 110. The rod 121 penetrates the upper housing 110 through a waterproof packing gland 123 in the front of the upper housing 110. The packing gland 123 forms a watertight seal, and may be embodied by an x-type, o-ring sealed system such as an IKELITE® camera control gland, for example. In an example, the control fitting 120 can have a depth rating of up to 100 m.

On the inside of the upper housing 110, the rod 121 is attached to a modified knob 122. Modified knob 122 has been hollowed to assume the shape (see at 124) of the sensitivity control knob of the magnetometer (see, as an example, sensitivity control knob 22 of FIG. 2B). Thus, with the sensitivity control knob of the magnetometer secured within modified knob 122, the diver has remote control via the knob of control fitting 120.

The upper housing 110 has a second penetration for a through housing electronics fitting 125. The electronics fitting 125 on the outside of the housing 110 is designed to receive a cable (not shown) which subsequently provides the diver with an audible signal from the magnetometer. The electronics fitting 125 penetrates the front of the housing 110 through a water tight packing gland (shown generally at 126, 127), and may be embodied as a 2-conductor through hole connector and includes a packing gland with a round o-ring biased against a flat mating surface. An example fitting is a Cooper Crouse Hinds® fitting Model 59F2M, having a depth rating of 100 m. The connection on the inside is designed to receive the headset cable 128 connected to the connector 129 that in turn is connected to the volume jack (such as jack 24 in FIG. 2A) of the magnetometer.

Using the magnetic locator of FIGS. 1-6 as an example, to secure the magnetometer 10 in place within housing 100, the base seal 130 is initially removed. The lower housing 12 of the magnetic locator 10 is inserted down into the lower housing 115. The connector 129 is inserted into the jack 24 of locator 10. The housing 14 is maneuvered so that the sensitivity control knob 22 fits into the hollowed-out modified knob 122 that forms part of the control fitting 120. Prior to closing, the diver hooks up a headset cable to electronics fitting 125 and does operational checks to make sure the magnetic locator 10 is operating properly.

With operational checks satisfactory, the base seal 130 is placed over the upper housing 110 such that the compression seal 138 biases against the seal 64 and mounting screw 72 of the magnetic locator 10 to ensure that the sensitivity control knob 22 seats within the modified knob 122 of control fitting 120. The latches 135/132 are then engaged and locked down under the cam stops 137. The magnetometer is now watertight, housing 100 may be hooked up to the diver's weight belt or harness via lanyard 140, and/or a carabiner of the air lift may be secured to attachment points of the clove-hitch line 160.

Figure 12:
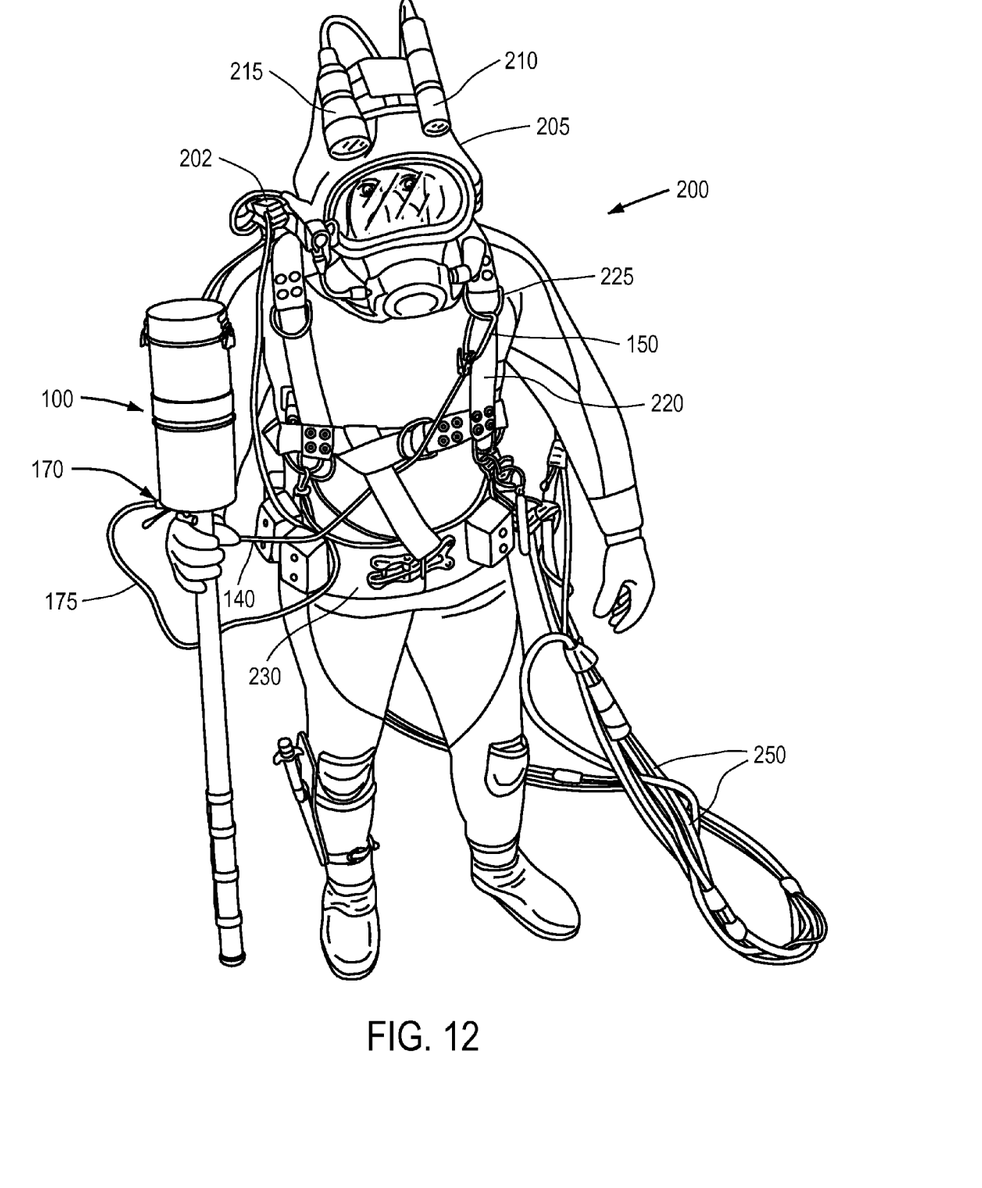
FIG. 12 is a picture of a diver hooked up to a combination including a magnetometer within a waterproof housing.

FIG. 12 is a picture of a diver hooked up to a combination including a magnetometer within a waterproof housing. As shown in FIG. 12, a diver 200 is shown holding a combination comprising a hand-held magnetometer within its waterproof housing 100. The lanyard 140 is attached to the diver 200's harness 220 by way of the clip 150 being attached to a ring 225. Alternatively the clip 150 could attach to a point on the diver's weight belt 230.

FIG. 12 further illustrates a plug connection 170 at the electronics fitting 125, from which extends a headset cable 175 for connection to the diver 200's communication interface 202 at the diver helmet 205. The diver 200 wears an earphone that is connected to the communication interface 202 to enable the diver 200 to hear audible changes in the magnetometer during a search. The diver helmet 205 further includes a camera 210 for real-time video (for use as a closed-circuit television (CCTV) for example), a back light 215, and a voice communications system (not shown) for two-way audio communications between the diver 200 and a diving supervisor who is remote from the diver 200. An umbilical 250 is attached to diver 200. The umbilical 250 includes HP air, LP air and electrical power cable feeds to the diver 200, and allows for closed-circuit feedback of the video to be sent to a command trailer on the beachhead.

EXAMPLES

A combination comprising a hand-held Model GA-52Cx Magnetic Locator, secured within the waterproof housing 100 shown in FIG. 12 was designed and employed by the inventors underwater at South Beach on the Island of Martha's Vineyard subsequent to the Army Corps of Engineers TCRA solicitation request. In the recovery of UXO, 2¼" rocket motors were located underwater at a depth below ground of almost 48'. This showed an improvement of almost 2× as compared to finding the same UXO on land. Five (5) inch warheads were found underwater at a depth below ground of approximately five feet. On average, UXO located in this TCRA was found at a depth equal to 11× the diameter of the ordinance, using an existing hand-held magnetometer within the inventors' waterproof housing.

In order to remove UXO on land, a systematic plan must be put into place before a search may begin. With the protection of the public the overriding principal, as imbued by stringent regulations promulgated by the Environmental Protection Agency (EPA) in consultation with the Department of Defense (DOD), each removal action is subject to various quality checks, known as quality control (QC) and quality assurance (QA) procedures. As an example, for a government sponsored UXO removal request, once a search is completed by a first search entity, a second entity (such as a contractor) performs a QC check on the procedures used in the search, and the government sends an independent QA inspector to confirm that the proper equipment was uses and that the proper principles and procedures were applied in the search. These QC and QA procedures for removing UXO and/or MEC on land have been in place for decades.

However, removing UXO or MEC underwater complicates these quality control and/or quality assurance process. Accordingly, the inventors have developed a method and system for the location and removal of UXO and/or MEC underwater which provides for a quality assurance check.

Figure 13:
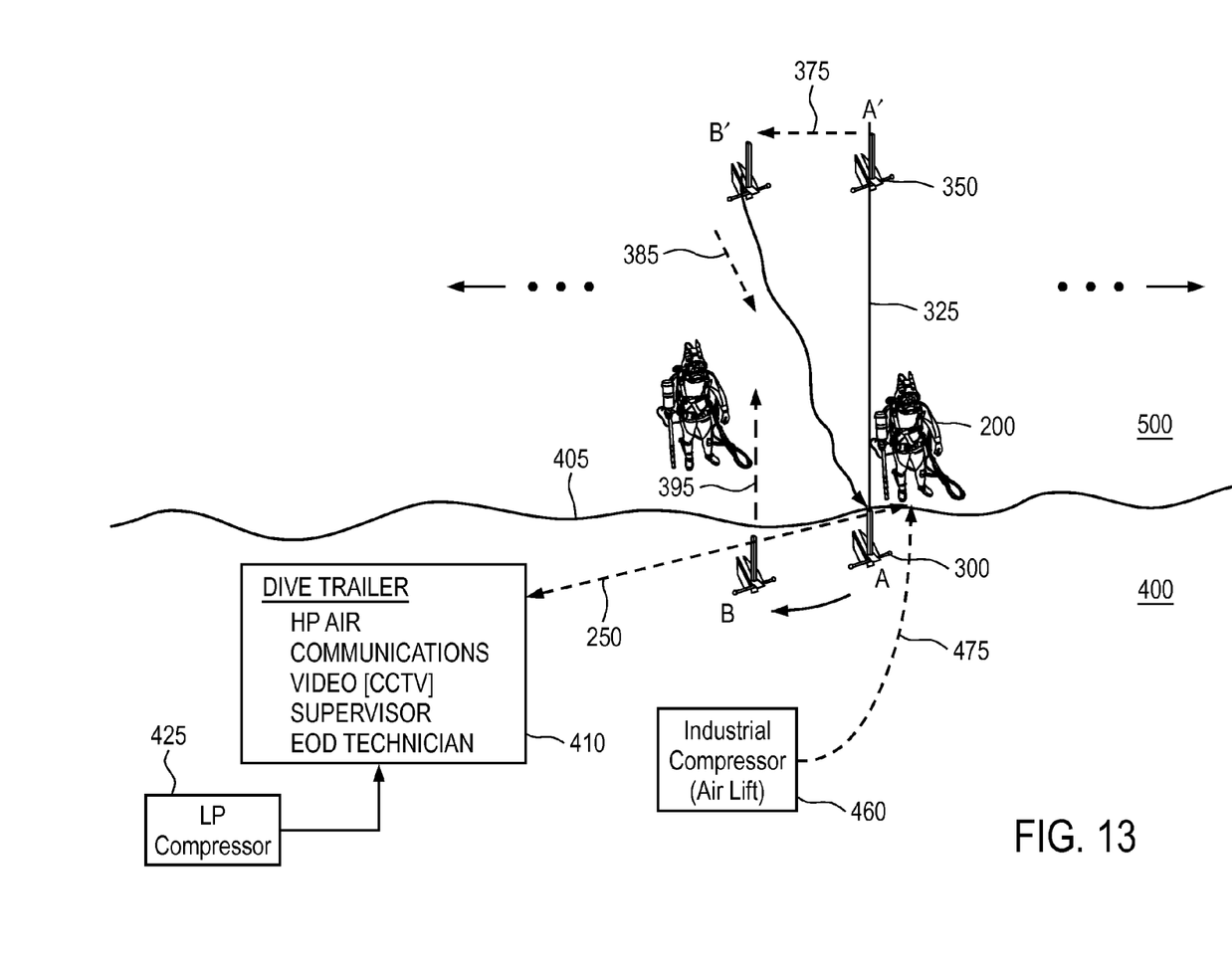
FIG. 13 is an illustration to describe a system for locating and removing UXO underwater, according to the example embodiments.

FIG. 13 is an illustration to describe a system for locating and removing UXO underwater. The following example describes a search in the shallows off of a beach; it being understood that the principles of the invention could be applied to deeper bodies of water. FIG. 13 illustrates a beachhead 400 and a generic body of water hereafter referred to as basin 500. Basin 500 contains submerged UXO and/or MEC that requires location and removal, in this example under the order of a TCRA from the Army Corps of Engineers.

The following is an example system erected on a beachhead; it being understood that the system could be deployed at sea on a vessel such as a boat or barge. In order to conduct the search and removal, a dive trailer 410 is set up on the beachhead 400 in the vicinity of the general area to be searched. The dive trailer 410 includes a LP air source from LP compressor 425 to feed the umbilical 250 for diver's air, a HP air source to the umbilical 250 for excavation, various wired and/or wireless communications lines extending to the diver 200, including real-time video equipment for CCTV communications with the diver 200, computer equipment to process data received from the magnetometer held by the diver 200 within the housing 100, and diver positioning system equipment to record the diver 200's position during his search. The diver positioning system may be embodied as any positioning system able to tie the diver 200 to a given point and accurately record diver position, including but not limited to GPS, A-GPS, acoustic, line-of-sight, etc.

Trailer 410 also includes the diving supervisor and an explosive ordinance disposal [EOD] technician, each of which are in voice communication with the diver 200. Additionally, each of the diving supervisor and EOD Tech has the ability to monitor the CCTV feed off of the diver 200's helmet 205. Hence, either person in the dive trailer 410 provides an independent check as to the quality control of the instruments and/or equipment, principles, and/or the procedures applied in the search.

An industrial compressor 460 is also placed on the beachhead 400. A hose 475 from the compressor 460 is connected to the air lift (not shown) for use by the diver 200 in the basin 500 during the search. To prep the initial search area, the diver 200 is hooked up to the umbilical 250 and all connections are tested on the beachhead 400 so that communications and air are established as satisfactory with the dive trailer 410. The air lift is tested and initially set aside. The housing 100 with magnetometer is tested and initially set aside until the guide line 325 for the search is set in the basin 500.

The diver 200 attaches the guide line 325 between a pair of anchors, such as Danforth anchors 300, 350, for example. The guide line 325 may be set to a desired length, one example being approximately 150 feet. The diver 200 secures anchor 300 at position A near the shoreline 405 on beachhead 400, then walks the guide line 325 outward under guidance from the diving supervisor, planting the second anchor 350 at a position A'. Grasping the guide line 325, diver 200 returns to the beachhead 400 to retrieve housing 100 with magnetometer therein in order to commence the search outward from position A, upon command from the diving supervisor. At this time, the diver 200 may also grab the air lift and hook it to his person (also attaching a carabiner on the air lift to clove-hitch line 160 on lower housing 115 as shown in FIG. 7) for on-the-spot excavation upon detection of an anomaly during his search. Of course, as the position of anomalies can be marked during the search and recorded at the dive trailer 400, as to be described hereafter, the diver 200 may elect to retrieve the air lift at a later time, i.e., during a later-scheduled UXO removal procedure, for example.

In general to conduct a search with the magnetometer, the diver 200 will grasp the guide line 325 and follow it between the two anchors 300, 350, sweeping the magnetometer for anomalies. Once the diver reaches position A', the diving supervisors will generally direct the diver 200 to reposition anchor 350 to position B' as shown by dotted line arrow 375. The diver 200 then continues his search down a different path (shown by line arrow 385) back to position A, moves anchor 300 to position B, begins a new search along path 395, etc. If an entire submerged landmass cannot be searched; a systematic search can be designed to statistically search only a sample of the landmass based on its future use, typically 1-3% of the entire landmass, for example.

Figure 14:
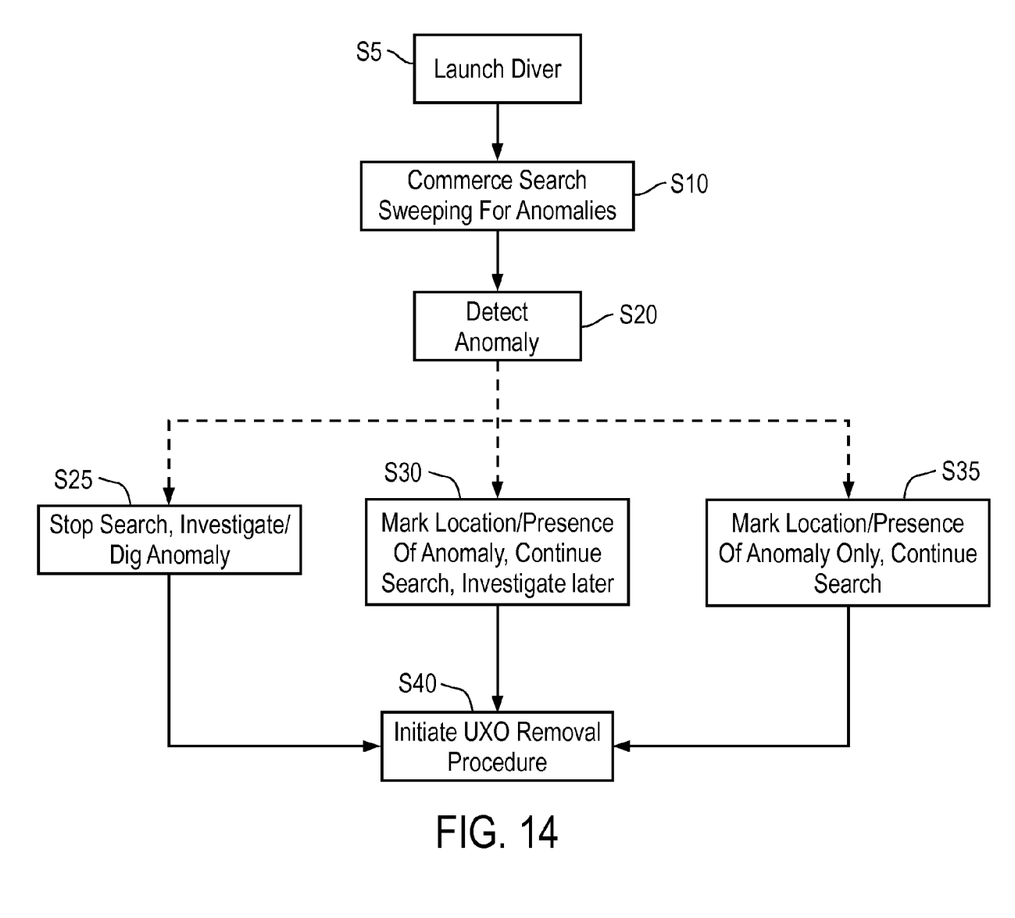
FIG. 14 is a flowchart describing a method of locating and removing unexploded ordinance in accordance with the example embodiments.

FIG. 14 is a flowchart describing a method of locating and removing unexploded ordinance in accordance with the example embodiments. Referring to FIG. 14, before launching the diver 200 the diving supervisor verifies that all preliminary steps have been completed, as described previously with regard to FIG. 13. For an indentified submerged landmass of interest, the following steps shall be performed. The diving supervisor launches the diver (S5) and the diver 200 grasps the guide line 325 at position A and begins the search (S10), proceeding to position A'. The diver 200 conducts his search for anomalies with the magnetometer, sweeping from side-to-side and listening for an increase in the frequency of the output signal that will present an ordinance-like response.

If a possible anomaly is detected (S20), the diver 200 is presented with three options, with steps S25, S30, S35 presented in dotted line to show the three possible steps. It should also be understood that detection data of the anomaly by the magnetometer and real-time video of the possible anomaly is also being recorded in the dive trailer 410.

As one option, the diver 200 may terminate the search and immediately investigate the object (S25), which may entail utilizing the air lift to dig the anomaly (if it is revealed to be UXO (or MEC)) at that time. Alternatively, the diver 200 may mark the location and presence of the anomaly (S30), for later consideration to return and further investigate for removal as UXO. In another alternative, the diver 200 may only mark the location and presence of the anomaly (S35), with no further consideration to return and further investigate the anomaly for removal.

In each of these steps (S25, S30, S35), the diving supervisor (or EOD tech), by virtue of having real-time video (as well as being in audio communication with) the diver 200, can perform a QA function to confirm that proper procedures and principles are in place during the search. Thus, a QA check may be performed as the diving supervisor, via CCTV, can ensure proper instrument response, that proper search techniques are being observed and can visually witness dig activity as if he/she were there next to the diver, as if on land.

With the diver 200 and diving supervisor having the location information, a removal procedure is initiated (S60). Typically the UXO removal procedure stems from instructions that are client-specific in nature. For example the procedure could entail removing all detected anomalies (UXO and non-UXO), only UXO (and/or MEC), etc. Using the location and presence information from the search and detection of anomalies, the diver 200 will use a guide line 325 and investigate/remove as many UXO as possible, consistent with the procedure promulgated by the client, along the guide line 325.

The camera 210 for real-time video with its back light 215 allows the diving supervisor to visually confirm the diver 200's determination that the anomalies are in fact UXO (or not) and should be removed (or not) as an imminent danger to the public, and/or that the job is being performed consistent with the removal procedure ordered by the client, and/or that the excavation of UXO/MEC is being performed with the proper instrumentation, equipment, procedures, etc. Accordingly, the use of CCTV, alone or in conjunction with voice communications between the diver in the water and the diving supervisor provides a critical QA component for UXO removal.

The example embodiments being thus described, it will be obvious that the same may be varied in many ways. Such variations are not to be regarded as departure from the example embodiments, and all such modifications as would be obvious to one skilled in the art are intended to be included herein.

What is claimed is:

1. A waterproof housing for underwater use by a diver of a hand-held magnetometer that is enclosed by the housing, comprising, an elongate, generally hollow tubular-shaped lower housing portion having a first diameter and being closed at one end and open at another end, the lower housing portion adapted to fully enclose an elongate lower tubular-shaped housing portion of the hand-held magnetometer, a cylindrically-shaped hollow upper housing portion having a second diameter substantially larger relative to the first diameter of the lower housing portion and attached to the open end of the lower housing portion, the upper housing portion open at its other end and adapted to enclose an electronics and power supply housing portion of the hand-held magnetometer, and a base seal removably connected to the open end of the upper housing portion, the base seal removed to insert the hand-held magnetometer therein so that its tubular-shaped housing portion slides through the upper housing portion into the lower housing portion and the electronics and power supply housing portion of the hand-held magnetometer is captured within the upper housing portion, the base seal secured into the upper housing portion open end to provide a fully functional hand-held magnetometer protected from water incursion at depth, the base seal further including:
  a central plug portion extending into the upper housing portion of the waterproof housing, the central plug portion including a pair of spaced o-rings that seal against an interior circumferential surface of the upper housing portion, the central plug portion including a compression seal at an end thereof that biases against the electronics and power supply housing portion of the hand-held magnetometer,
  a pair of spaced latches on opposite external side surfaces of the seal that mate with corresponding clamp latches attached to a circular clamp on the outer surface of the upper housing portion, each set of latches coming into locked engagement under the actuation of a corresponding cam lock on the circular clamp to secure the base seal onto the upper housing portion, and
  a test port extending from the top of the base seal.

2. The housing of claim 1, wherein the upper and lower housing portions are composed of a non-ferrous material.

3. The housing of claim 2, wherein the non-ferrous material is selected from a group comprising aluminum, a polycarbonate and ABS.

4. The housing of claim 1, further comprising:
a control fitting penetrating the upper housing portion of the waterproof housing and permitting the diver to adjust the sensitivity settings on the hand-held magnetometer within the waterproof housing.

5. The housing of claim 4, wherein the control fitting further includes an external knob connected to a rod, the rod extending through a watertight packing gland in the upper housing portion into the interior of the upper housing portion and terminating at a control knob, the control knob directly connected to a sensitivity control knob on the hand-held magnetometer within the waterproof housing.

6. The housing of claim 1, further comprising:
an electronics fitting penetrating the upper housing portion for facilitating the diver to connect a headset to the hand-held magnetometer within so as to receive an audible signal from the hand-held magnetometer.

7. The housing of claim 6, wherein the electronics fitting penetrates the upper housing portion through a watertight packing gland into the interior thereof and receives a headset cable that is connected to a connector that in turn is connected to a volume jack of the hand-held magnetometer within the waterproof housing.

8. The housing of claim 1, further comprising:
a lanyard connected to the upper housing portion, the lanyard including a clip at an end thereof for removably attaching the waterproof housing to the diver.

9. The housing of claim 1, wherein
the lower housing portion includes a length of clove-hitch line divided by a plurality of adhesive strips to form attachments points, and
the attachment points are configured to receive a carabiner attached to an air lift used by the diver for removing debris concurrent with using the hand-held magnetometer enclosed within the waterproof housing to search for an anomaly of interest.

10. A combination, comprising,
a hand-held magnetometer, the magnetometer comprising a first housing enclosing electronics and one or more power supplies and an elongate, tubular-shaped second housing enclosing one or more sensors that is attached to the first housing, and
a waterproof housing enclosing the hand-held magnetometer for underwater use by a diver grasping a portion of the waterproof housing, the housing having a first portion open at one end and connected to a second portion with one end open and accessible through the first portion and terminating at a closed end, wherein the hand-held magnetometer is inserted into the first portion open end so that the second housing of the hand-held magnetometer is received into the second portion and the first housing of the hand-held magnetometer is received into the first portion, the first and second portions of the waterproof housing thereby completely enclosing the hand-held magnetometer, and
a base seal is inserted into the first portion open end to provide a fully functional magnetometer protected from water incursion at depth,
the base seal further including:
a central plug portion extending into the first portion of the waterproof housing, the central plug portion including a pair of spaced o-rings that seal against an interior circumferential surface of the first portion, the central plug portion including a compression seal at an end thereof that biases against the first housing of the hand-held magnetometer,
a pair of spaced latches on opposite external side surfaces of the seal that mate with corresponding clamp latches attached to a circular clamp on the outer surface of the first portion of the waterproof housing, each set of latches coming into locked engagement under the actuation of a corresponding cam lock on the circular clamp to secure the base seal onto the first portion of the waterproof housing, and
a test port extending from the top of the base seal.

11. The combination of claim 10, further comprising:
a control fitting penetrating the first portion of the housing and permitting diver to adjust the sensitivity settings on the hand-held magnetometer within.

12. The combination of claim 11, wherein the control fitting further includes an external knob connected to a rod, the rod extending through a watertight packing gland in the first portion into the interior of the first portion of the waterproof housing and terminating at a control knob, the control knob directly connected to a sensitivity control knob on the hand-held magnetometer within the waterproof housing.

13. The combination of claim 10, further comprising:
an electronics fitting penetrating the first portion of the waterproof housing for facilitating diver to connect a headset to the hand-held magnetometer within so as to receive an audible signal from the hand-held magnetometer.

14. The combination of claim 13, wherein the electronics fitting penetrates the first portion of the waterproof housing through a watertight packing gland into the interior thereof and receives a headset cable that is connected to a connector that in turn is connected to a volume jack of the hand-held magnetometer within the waterproof housing.

15. The combination of claim 10, further comprising:
a lanyard connected to the first portion of the waterproof housing, the lanyard including a clip at an end thereof for removably attaching the waterproof housing to diver.

* * * * *